United States Patent
Choi et al.

(10) Patent No.: US 7,361,228 B2
(45) Date of Patent: Apr. 22, 2008

(54) SHOWERHEADS FOR PROVIDING A GAS TO A SUBSTRATE AND APPARATUS

(75) Inventors: Young-Bae Choi, Gyeonggi-do (KR); Moon-Sook Lee, Seoul (KR); Byoung-Jae Bae, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 386 days.

(21) Appl. No.: 11/060,525

(22) Filed: Feb. 17, 2005

(65) Prior Publication Data
US 2005/0183826 A1 Aug. 25, 2005

(30) Foreign Application Priority Data
Feb. 24, 2004 (KR) ............. 10-2004-0012093

(51) Int. Cl.
C23C 16/455 (2006.01)
C23C 16/00 (2006.01)
C23F 1/00 (2006.01)
H01L 21/306 (2006.01)

(52) U.S. Cl. .............. 118/715; 156/345.33; 156/345.34
(58) Field of Classification Search ........... 156/345.33, 156/345.34; 118/715
See application file for complete search history.

(56) References Cited
U.S. PATENT DOCUMENTS 5,013,384 A * 5/1991 Mellink et al. ........ 156/345.34
6,173,673 B1 1/2001 Golovato et al.
6,364,949 B1 * 4/2002 Or et al. ........................ 118/69
7,141,756 B2 * 11/2006 Ohmi et al. ........... 219/121.43
2001/0029891 A1 * 10/2001 Oh et al. ..................... 118/722
2003/0089314 A1 * 5/2003 Matsuki et al. ............. 118/715
2005/0011447 A1 * 1/2005 Fink ............................ 118/715

FOREIGN PATENT DOCUMENTS

| JP | 1-128519 | 5/1989 |
| JP | 7-142401 | 6/1995 |
| JP | 2000-269146 | 10/2003 |
| KR | 00008777 | 5/2000 |
| WO | WO01/74534 A2 | 10/2001 |

* cited by examiner

*Primary Examiner*—Jeffrie R. Lund
*Assistant Examiner*—Satish Chandra
(74) *Attorney, Agent, or Firm*—Myers Bigel Sibley & Sajovec (57) ABSTRACT

Showerheads including a plate having a plurality of gas outlet holes extending therethrough and a head cover coupled to the plate to form a space between the plate and the head cover. A gas supply inlet member is configured to provide gas to the space directed toward the head cover. A gas distribution member on an inner face of the head cover facing the space is configured to partially suppress flow of the gas provided to the space in a direction along the gas distribution member to substantially uniformly distribute the gas in the space. The direction along the gas distribution member may be a horizontal direction and the gas provided to the space is directed in a substantially vertical upward direction. Apparatus and methods using the showerheads are also provided.

25 Claims, 8 Drawing Sheets

SHOWERHEADS FOR PROVIDING A GAS TO A SUBSTRATE AND APPARATUS

CROSS-REFERENCE TO RELATED APPLICATION

This application is related to and claims priority from Korean Patent Application No. 2004-12093 filed on Feb. 24, 2004, the disclosure of which is hereby incorporated herein by reference in its entirety.

BACKGROUND OF THE INVENTION

The present invention relates to a showerhead, an apparatus for processing a semiconductor substrate, and more particularly, to an apparatus having a showerhead and a method of distributing a gas using the same.

Semiconductor devices are provided for various data storage and processing applications having a high integration density and performance. To manufacture such high integration density and high performance semiconductor devices, it is generally important to use technology that will accurately form a thin film pattern on a semiconductor substrate.

The technology approaches for forming the thin film pattern on the semiconductor substrate may generally be divided into a physical vapor deposition (PVD) process and a chemical vapor deposition (CVD) process. In addition, it is known to form a thin film pattern by an atomic layer deposition (ALD) process that may more accurately form a thin layer.

The CVD and the ALD process may operate based on a chemical reaction between a source gas AX and a reaction gas BY. The chemical reaction process may be represented by the following chemical reaction equation:

$$AX(g)+BY(g) \rightarrow AB(s)+XY(g)$$

To facilitate the chemical reaction between the source gas and the reaction gas, the gases may be heated at a high temperature or may be exposed to a high voltage using a showerhead. The showerhead generally heats the source and reaction gases or exposes the gases to the high voltage as well as spraying the gases on the semiconductor substrate.

A conventional showerhead for converting a process gas into a plasma state is disclosed in U.S. Pat. No. 6,173,673 issued to Golovato, et al. The conventional showerhead typically has a cylindrical shape. The showerhead is generally disposed over a process chamber in which a semiconductor substrate is manufactured. The source and reaction gases may then be introduced into the process chamber through the showerhead.

Figure 1:
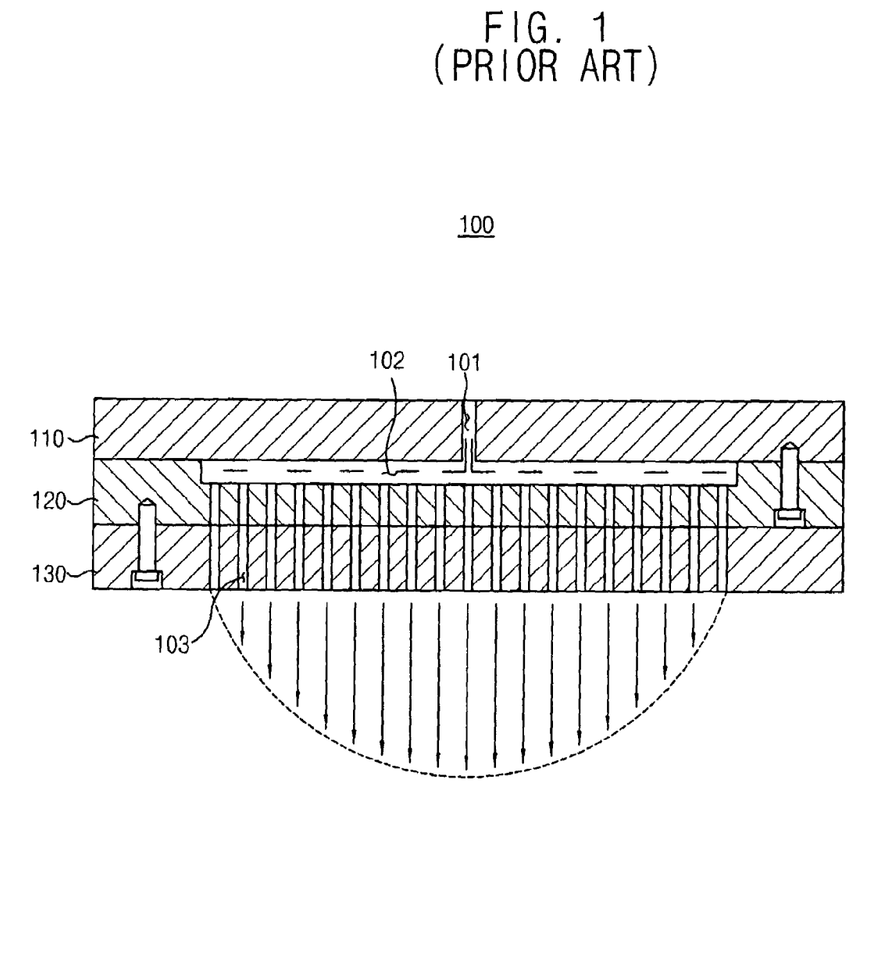
FIG. 1 is a cross sectional view illustrating a conventional showerhead.

FIG. 1 is a cross sectional view illustrating a conventional showerhead 100. Referring now to FIG. 1, the showerhead 100 has a cylindrical shape including an inner space. The showerhead 100 includes a head cover 110, and first and second plates 120 and 130 having holes shown as defining gas outlets 103. The first plate 120 is coupled to a lower face of the head cover 110. A diffusion space 102 is formed between the head cover 110 and the first plate 120 when they are coupled together. The second plate 130 is coupled to a lower face of the first plate 120.

A gas inlet 101 is formed through the head cover 110. The gas outlets 103 extend through the first and second plates 120 and 130. The gas inlet 101 is in fluid communication with the diffusion space 102. The diffusion space 102 is also in fluid communication with the gas outlets 103.

A source gas or a reacting gas is introduced into the showerhead 100 through the gas inlet 101. The gas flows downwardly from the gas inlet 101 and widely diffuses in the diffusion space 102. The gas may then be distributed on a semiconductor substrate (not shown) through the gas outlet 103. However, as the diffusion space 102 in the conventional showerhead 100 has a relatively small volume, gas distributions in the diffusion space 102 may vary significantly at different positions relative to the gas inlet 101 and with the number of gas inlets provided.

When a gas is introduced into the diffusion space 102 through a gas inlet 101 that is positioned at a central portion of the head cover 110, as shown in FIG. 1, the gas may be concentrated in a central portion of the diffusion space 102. The gas concentration in the central portion of the diffusion space 102 may cause the gas to be distributed preferentially on a central portion of the semiconductor substrate through the gas outlets 103 that are positioned at central portions of the first and second plates 120 and 130. Thus, a more extensive gas deposition reaction may be generated at the central portion of the semiconductor substrate as compared to an edge portion of the semiconductor substrate. As a result, a layer on the semiconductor substrate formed by the deposition reaction may have an uneven thickness that is gradually thinned from the central portion to the edge portion of the semiconductor substrate.

A layer having an uneven thickness may cause failure problems for a semiconductor device, such as deteriorating characteristics of the semiconductor device. Although various conventional technologies have been developed that are addressed to the above-mentioned problems, these technologies have failed to overcome the problems.

For example, in accordance with one known conventional technology, the gas inlet 101 is blocked and a gas pipe is built in the first plate 120. The gas is jetted out from the central portion of the first plate 120 to the head cover 110. Thus, more gas may be provided to the edge portion of the diffusion space 102 as compared to the central portion of the diffusion space 102. As a result, the gas distribution to the edge portion of the first and second plates 120 and 130 may be increased.

However, the gas distribution to the central portion of the first and second plates 120 and 130 may be decreased, whereas the gas distribution on the edge portion of the first and second plates 120 and 130 is increased. Therefore, the deposition reaction at the edge portion of the semiconductor substrate may exceed that at the central portion of the semiconductor substrate. As a result, a layer on the semiconductor substrate may have an uneven thickness that is gradually thickened from the central portion to the edge portion of the semiconductor substrate.

As described above, when the gas is not uniformly distributed on the semiconductor substrate from the conventional showerhead 100, the layer on the semiconductor substrate may have an uneven surface. When other layers are formed on the uneven surface of the layer in following processes, errors may be generated in the following processes, which may deteriorate performance characteristics of a semiconductor device.

SUMMARY OF THE INVENTION

Embodiments of the present invention provide showerheads including a plate having a plurality of gas outlet holes extending therethrough and a head cover coupled to the plate to form a space between the plate and the head cover. A gas supply inlet member is configured to provide gas to the space directed toward the head cover. A gas distribution member on an inner face of the head cover facing the space is configured to partially suppress flow of the gas provided to the space in a direction along the gas distribution member to substantially uniformly distribute the gas in the space. The direction along the gas distribution member may be a horizontal direction and the gas provided to the space is directed in a substantially vertical upward direction. The showerhead may be a showerhead for a semiconductor substrate processing apparatus and the gas may be a source gas and/or a reaction gas for forming a film on the semiconductor substrate.

In some embodiments of the present invention, the gas distribution member is a stepped structure providing a height of the space that decreases from a position where the gas is provided to the space to a position in the space displaced therefrom. The position where the gas is provided may be in a central portion of the space and the stepped structure may be convex. Alternatively, the position where the gas is provided may be in an edge portion of the space and the stepped structure may be concave. The plurality of gas outlet holes may be arranged in concentric circles and the stepped structure may have a corresponding arrangement of steps aligned with the concentric circles of gas outlet holes. The stepped structure may be a plurality of stepped grooves formed in the inner face of the head cover.

In other embodiments of the present invention, the gas distribution member is concentrically arranged with respect to a position from which the gas is provided and is configured to partially suppress a horizontal flow of the gas in the space. The gas distribution member may be a stepped structure on an inner face of the head cover facing the plate. The stepped structure may include stepped portions.

In further embodiments of the present invention, the position corresponds to at least one position in a central portion of the space, and the stepped structure includes stepped grooves concentrically positioned on the inner face of the head cover. The position may correspond to a plurality of positions that are arranged on a substantially common plane at substantially identical angular intervals around a central axis of the space. In other embodiments, the position corresponds to a plurality of positions that are arranged at spaced apart locations along an edge portion of the space at substantially identical angular intervals around a central axis of the space, and the stepped structure includes stepped protrusions that are concentrically positioned on the inner face of the head cover. The position may correspond to a plurality of positions that are arranged at spaced apart locations from a central portion to an edge portion of the space at substantially identical intervals in the space, and the stepped structure may include annular grooves concentrically positioned on the inner face of the head cover.

In other embodiments of the present invention, the gas supply inlet member is inserted into the plate in a horizontal direction. The shower head may further include a sealing member enclosing a lower portion of the plate, a second plate coupled to the seating member to form a second space between the sealing member and the second plate and a second gas supply inlet member that is configured to provide a second gas to the second space in a direction toward the plate. The second gas supply inlet member may extend from an edge portion of the second space to a central portion of the second space. The second gas supply inlet member may be inserted into the second plate in a horizontal direction.

In yet further embodiments of the present invention, apparatus for processing a substrate include a process chamber configured to receive a substrate to be processed therein and a chuck in the process chamber that supports the substrate. A showerhead is positioned to provide a gas to the process chamber. The showerhead includes a plate having a plurality of gas outlet holes extending therethrough, a head cover coupled to the plate to form a space between the plate and the head cover, a gas supply inlet member configured to provide gas to the space directed toward the head cover and a gas distribution member on an inner face of the head cover facing the space that is configured to partially suppress flow of the gas provided to the space in a direction along the gas distribution member to substantially uniformly distribute the gas in the space.

In other embodiments of the present invention, the gas distribution member is concentrically arranged with respect to a position from which the gas is supplied, the gas distribution member partially suppressing a horizontal flow of the gas. The apparatus further includes a discharging member configured to discharge remaining gas and byproducts generated in a process for processing the substrate to control a pressure in the process chamber.

In further embodiments of the present invention, a high-frequency power source provides a high-frequency power to the showerhead to convert the gas in the process chamber into a plasma. A heating member and a cooling member may be provided that control a temperature of the gas. The heating member may enclose the showerhead, and the cooling member may be arranged on the showerhead.

In yet other embodiments of the present invention, methods of distributing a gas include providing a showerhead that includes a plate and a head cover coupled to the plate to form a space between the plate and the head cover A gas is provided to the space in a direction toward the head cover. A horizontal flow of the gas in the space is partially suppressed to substantially uniformly distribute the gas in the space.

In some embodiments of the present invention, partially suppressing the horizontal flow of the gas includes partially suppressing the horizontal flow with a stepped structure positioned on a face of the head cover facing the plate. The stepped structure may include stepped portions. The stepped structure may include concentric stepped grooves on the face of the head cover and the gas being may be sprayed from a central portion of the space to the stepped grooves. In other embodiments, the stepped structure includes concentric stepped protrusions on the face of the head cover and the gas is sprayed from a central portion of the space to the stepped protrusions. The stepped structure may include concentric annular grooves spaced apart from each other by substantially identical intervals and the gas may be sprayed from a central portion of the space to the annular grooves.

In yet further embodiments of the present invention, showerheads include a plate having a plurality of gas outlet holes extending therethrough. A head cover is coupled to the plate to form a space between the plate and the head cover. A gas supply inlet member is configured to provide gas to the space directed toward the head cover. A gas distribution member on an inner face of the head cover facing the space includes a stepped structure providing a height of the space that decreases from a position where the gas is provided to the space to a position in the space displaced therefrom.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
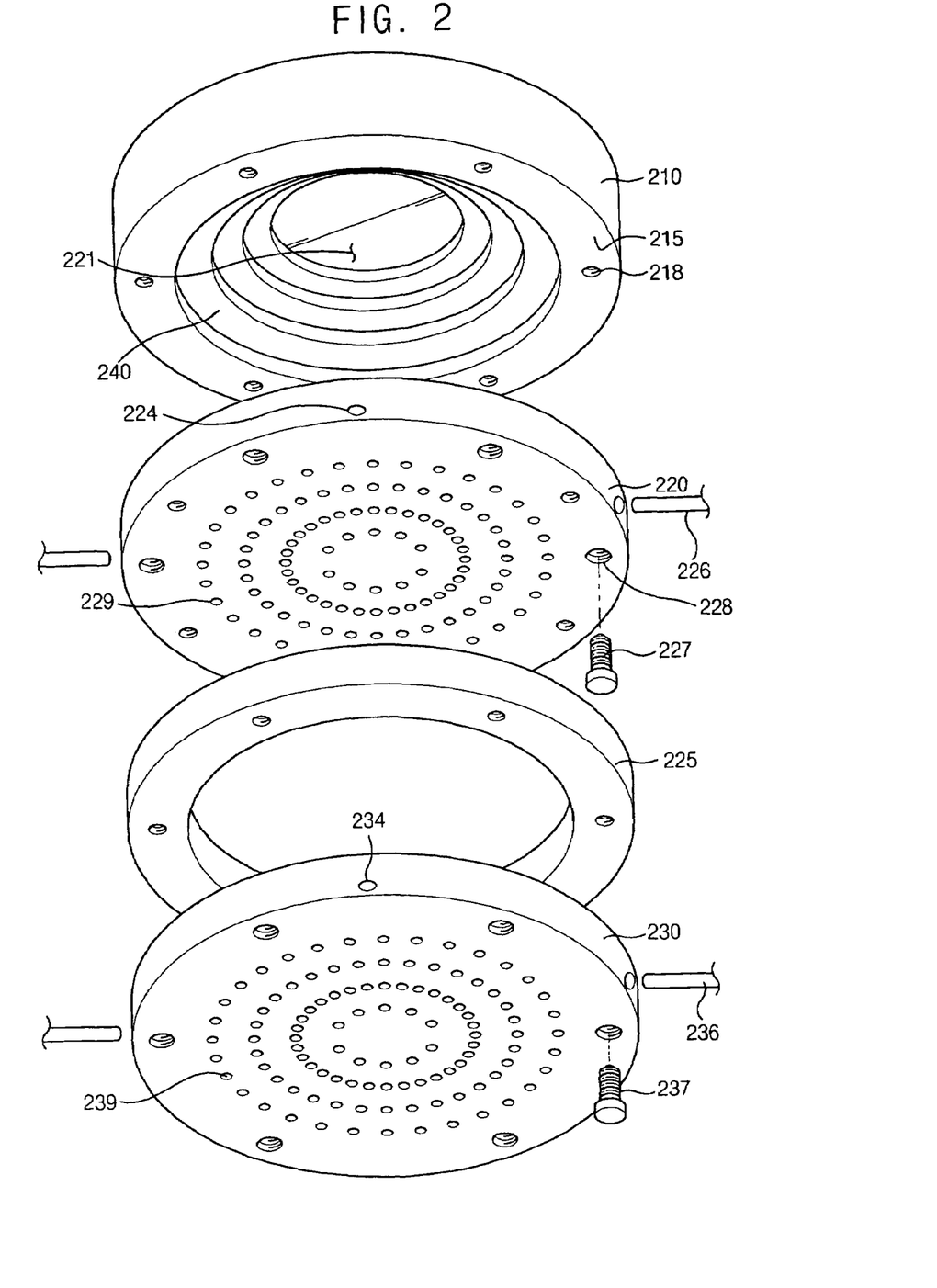
FIG. 2 is an exploded perspective view illustrating a showerhead in accordance with some embodiments of the present invention.

Various embodiments of the present invention will now be described with reference to FIGS. 2-4. FIG. 2 is an exploded perspective view illustrating a showerhead, FIG. 3 is an enlarged cross sectional view illustrating a diffusion of a gas generated in the showerhead in FIG. 2 and FIG. 4 is an enlarged plan view illustrating a plate and a gas supply member of the showerhead of FIG. 2 in accordance with some embodiments of the present invention.

Figure 3:
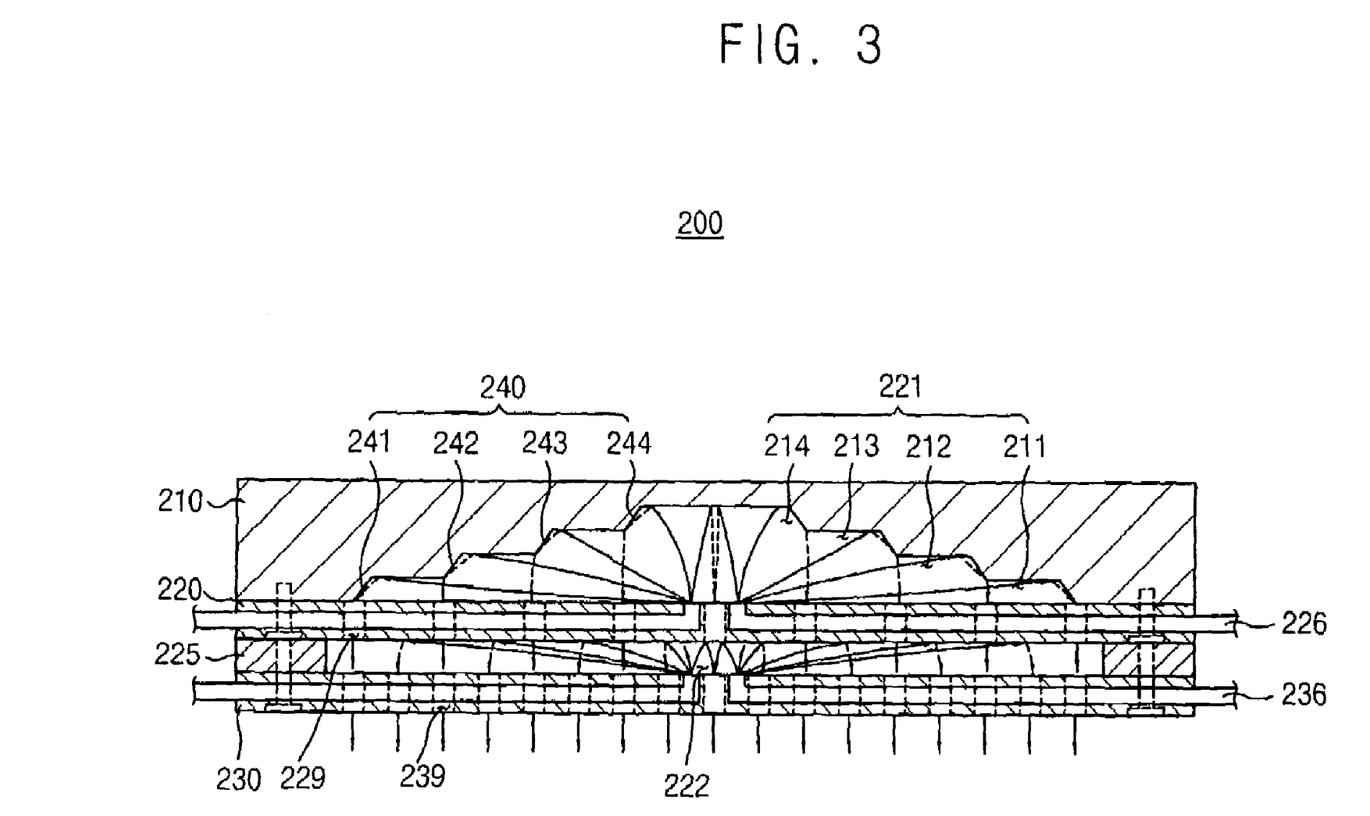
FIG. 3 is an enlarged cross sectional view illustrating diffusion of a gas generated in the showerhead of FIG. 2 according to some embodiments of the present invention.
Figure 4:
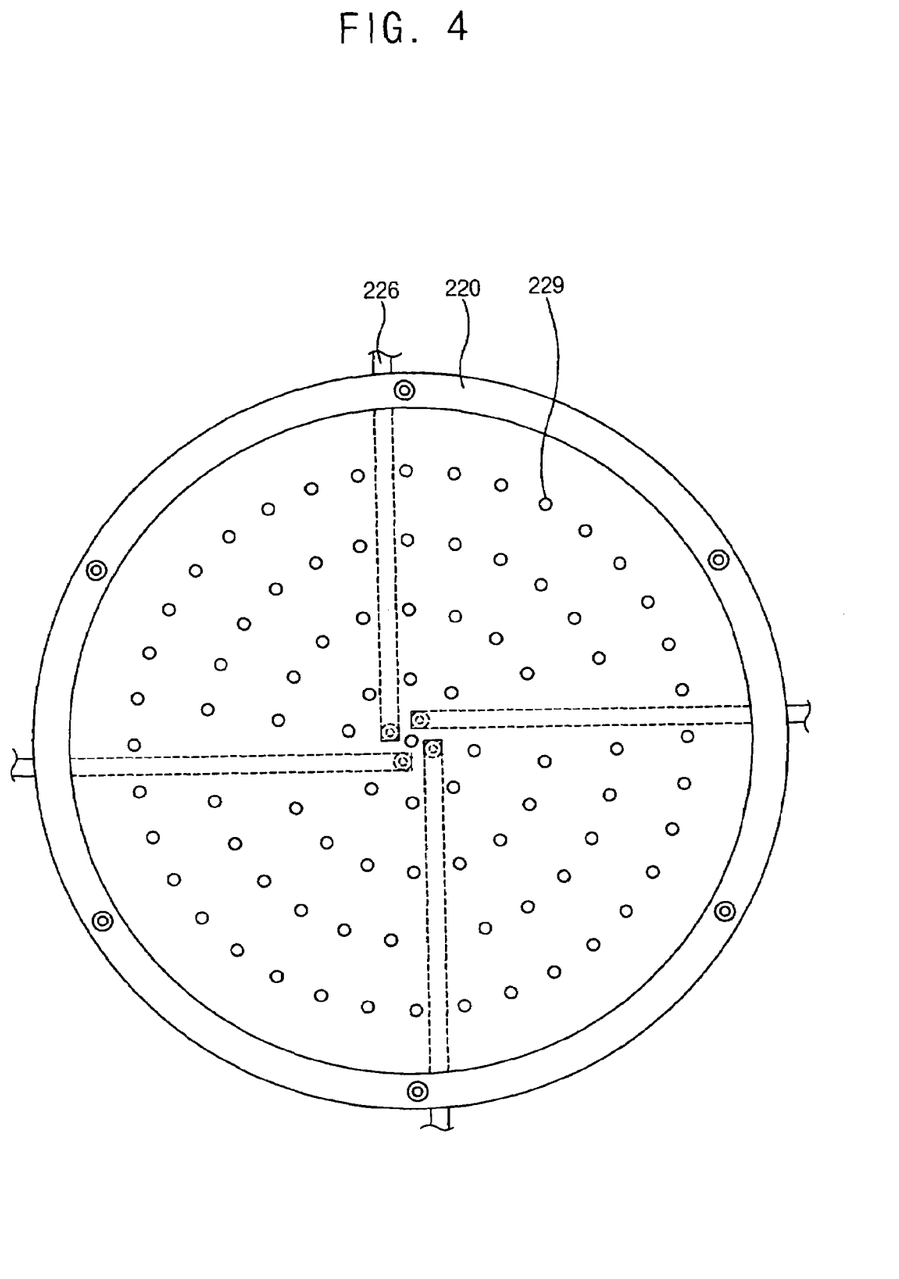
FIG. 4 is an enlarged plan view illustrating a plate and a gas supply member for the showerhead of FIG. 2 in accordance with some embodiments of the present invention.

Referring to FIGS. 2 to 4, a showerhead 200 of the illustrated embodiments includes a head cover 210, a first plate 220, a sealing member 225, a second plate 230, a first gas supply line 226, a second gas supply line 236, and a gas distribution member 240 defined by the head cover 210.

The head cover 210 may have a cylindrical shape, and may be formed of aluminum and/or steel. A stepped structure is formed in a lower face 215 of the head cover 210. The stepped structure defines a first diffusion space 221 in the head cover 210.

In particular, a cylindrical first groove 211 having a first diameter is vertically formed at the lower face 215 of the head cover 210. A second groove 212 having a second diameter less than the first diameter is formed from an inner end of the first groove 211. A third groove 213 having a third diameter less than the second diameter is formed from an inner end of the second groove 212. A fourth groove 214 having a fourth diameter less than the third diameter is formed from an inner end of the third groove 213. Thus, a first stepped portion 241 is formed between the first groove 211 and the lower face 215. A second stepped portion 242 is formed between the first and second grooves 211 and 212. A third stepped portion 243 is formed between the second and third grooves 212 and 213. A fourth stepped portion 244 is formed between the third and the fourth grooves 213 and 214. The four stepped portions 241, 242, 243, 244 of the illustrated embodiments comprise the gas distribution member 240. The stepped structure is formed from the lower face 215 of the head cover 210 to define the first diffusion space 221 in the head cover 210.

In the illustrated embodiments of FIG. 2, the first, the second, the third and the fourth stepped portions 241, 242, 243 and 244 are respectively formed from the lower face 215 of the head cover 210 by the first, the second, the third and the fourth grooves 211, 212, 213 and 214 that have different respective diameters. The first diffusion space 221 includes the first, the second, the third and the fourth grooves 211, 212, 213 and 214.

The first diffusion space 221 has a diameter that is gradually stepwise decreased and a depth that is correspondingly gradually stepwise increased from the first stepped portion 241 to the fourth stepped portion 244. In other words, the first diffusion space 221 has a stepped radial structure with respect to the first stepped portion 241. When a gas is introduced into the first diffusion space 221, the stepped structure substantially uniformly distributes the gas in the first diffusion space 221 from a central through an outer edge region thereof. As noted above, the stepped structure including the first, the second, the third and the fourth stepped portions 241, 242, 243 and 244 will be collectively referred to herein as the gas distribution member 240.

In some embodiments of the present invention, an annular groove (not shown) having a diameter substantially equal to or greater than the first diameter of the first groove 211 may be formed at the lower face 215 of the head cover 210. A detachable gas distribution member (not shown) having a stepped structure therein may be inserted into the annular groove. A stepped diffusion space (not shown) having a shape substantially identical to the first diffusion space may thereby be formed in the head cover 210 having the detachable gas distribution member. In other words, the one part structure 210 illustrated in FIG. 2 may be a multi-part structure.

In addition, while four stepped portions are shown as defining the gas distribution member 240 in the illustrated embodiments of FIGS. 2-4, more or less stepped portions may be used and the number thereof may vary based on the number and pattern of arrays of first outlet holes 229 in the first plate 220.

As shown in the embodiments of FIGS. 2-4, the first plate 220 is coupled to the lower face 215 of the head cover 210 to define the first diffusion space 221 between the first plate 220 and the head cover 210. The first plate 220 may have an outer diameter substantially identical to that of the head cover 210. As shown in FIGS. 2 and 3, vertical distances between the lower face 215 of the head cover and an upper face of the first plate 220 are gradually decreased from a central portion of the first plate 220 to an edge portion of the first plate 220.

First holes 218, which may be threaded or unthreaded, for attaching the first plate 220 are formed through an edge portion of the head cover 210 that makes contact with the first plate 220. As seen in FIG. 2, a plurality of the first holes 218 may be disposed around the edge portion of the head cover 210. Second holes 228, which may be threaded or unthreaded, aligned with corresponding ones of the first holes 218 are formed through the edge portion of the first plate 220. First screw(s) 227, one of which is shown in FIG. 2, are inserted into the first and the second holes 218 and 228 to attach the first plate 220 to the head cover 210. The first plate 220 may be formed from the same material as the head cover 210, such as a metal.

The first plate 220 shown in the embodiments of FIGS. 2-4 has a plurality of first outlet holes 229. The first outlet holes 229 extend vertically through the first plate 220. In the illustrated embodiments, there is a greater density of the first outlet holes 229 disposed within a region of the central portion of the first plate 220. The higher density region may have a diameter substantially equal to or less than the first diameter of the first groove 211.

A first horizontal hole 224 (or a plurality of radially displaced horizontal holes) is formed in a horizontal direction extending into the first plate 220. The first horizontal hole 224 extends from a side face of the first plate 220 to the central portion of the first plate 220. For the embodiments of FIGS. 2-4, the first horizontal hole 224 does not intersect any of the first outlet holes 229. An inner end of the first horizontal hole 224 adjacent to the central portion of the first plate 220 is upwardly opened. In other words, the first horizontal hole 224 generally has an L shape.

A first gas supply line 226 (or lines as seen in FIG. 4) having a tubular shape is inserted into the first horizontal hole 224. The first gas supply line 226 has a diameter substantially equal to or less than that of the first horizontal hole 224 and also has a length longer than that of the first horizontal hole 224. The first gas supply line 226 is connected to a gas reservoir (not shown) containing a supply of a gas or gases to be used in a manufacturing process. The gas is introduced into the first diffusion space 221 through the first gas supply line 226. The first gas supply line 226 in the illustrated embodiments terminates at a position that is adjacent to the inner end of the first horizontal hole 224. As a result, the gas may be readily provided to the inner end of the first horizontal hole 224 through the first gas supply line 226.

The gas (hereinafter, referred to as a first gas) passing through the first gas supply line 226 is jetted from an opening formed at the central portion of the first plate 220. That is, the opening is in fluid communication with the first horizontal hole 224. The first gas is delivered from the first plate 220 into the first diffusion space 221.

As shown in FIG. 4, to facilitate provision of the first gas into the first diffusion space 221, four first horizontal holes 224 are formed through the first plate 220 rotationally offset by a substantially identical angle, shown as about 90° in FIG. 4. Four first gas supply lines 226 are provided to the respective four first horizontal holes 224.

While four first gas supply lines 226 arranged by an offset angle of about 90° on a substantially identical plane are shown in FIG. 4, the present invention is not limited to such an arrangement. The numbers and intervals of the first gas supply line(s) 226 may vary in various embodiments of the present invention as will be understood by those skilled in the art. Further, although the first gas supply line 226 is received in the first plate 220 in the illustrated embodiments, the first gas supply line 226 may also be disposed over the first plate 220.

The circular second plate 230 is disposed under the first plate 220. The second plate 230 may have a diameter substantially identical to that of the first plate 220. The sealing member 225, having a ring shape, is interposed between the first and second plates 220 and 230 to define a second diffusion space 222 between the first plate 220 and the second plate 230. A second gas may be introduced into the second diffusion space 222.

The second plate 230 in the illustrated embodiments has a configuration substantially identical to that of the first plate 220. Second outlet holes 239 corresponding to the first outlet holes 229 are formed extending through the second plate 230. The second outlet holes 239 may be concentrated within a region in a central portion of the second plate 230 that corresponds to that of the first plate 220. The second plate 230 may be formed of a material, such as a metal, substantially identical to that of the first plate 220.

The sealing member 225 and the second plate 230 may be attached to the first plate 220 using a second screw 237 or screws (one shown in FIG. 2). Attaching the sealing member 225 and the second plate 230 to the first plate 220 using the second screw 237 may be carried out in generally the same manners as described with reference to attaching the first plate 220 to the head cover 210 using the first screw(s) 227.

Second horizontal holes 234 are formed in the second plate 230 in a horizontal direction. In the illustrated embodiments four second horizontal holes 234 are provided at rotationally displaced locations at substantially equal angular intervals. Second gas supply lines 236 are inserted into corresponding ones of the second horizontal holes 234. Inserting the second gas supply lines 236 into the second horizontal holes 234 may be performed in substantially the same manner as described with reference to inserting the first gas supply lines 226 into the first horizontal lines 224.

Operations related to generally uniformly distributing the first and second gases using the showerhead of FIGS. 2-4 according to various embodiments of the present invention will now be described. The first plate 220, the sealing member 225 and the second plate 230 are sequentially disposed under the head cover 210. The first gas supply line 226 is installed in the first plate 220 and the second gas supply line 236 is installed in the second plate 230.

The first gas passing through the first gas supply line 226 is jetted from the central portion of the first plate 220 to the central portion of the head cover 210. The jetted first gas diffuses in a substantially spherical shaped pattern and then contacts the gas distribution member 240. For example, after a portion of the first gas sprayed onto the fourth groove 214 diffuses horizontally and contacts the fourth stepped portion 244, the portion of the first gas sprayed onto the fourth groove 214 drops downwardly (i.e., back towards the first plate 220. After a portion of the first gas sprayed onto the third groove 213 diffuses horizontally and contacts against the third stepped portion 243, the portion of the first gas sprayed onto the third groove 213 drops downwardly. After a portion of the first gas sprayed onto the second groove 212 diffuses horizontally and contacts the second stepped portion 242, the portion of the first gas sprayed onto the second groove 212 drops downwardly. A portion of the first gas sprayed onto the first groove 211 diffuses horizontally and contacts the first stepped portion 241, and then the portion of the first gas sprayed onto the first groove 211 drops downwardly. As a result, in some embodiments of the present invention, the first gas may be uniformly distributed onto the upper face of the first plate 220. To uniformly distribute the first gas onto the first plate 220, the first, the second, the third and the fourth stepped portions 241, 242, 243 and 244 may be provided as tapered structures inclined by a predetermined angle.

The fluid mechanics of flows of the first gas may be very complicated. Thus, completely analyzing the actual flows of the first gas may be very difficult. Accordingly, the flows of the first gas are schematically analyzed herein. For the illustrated embodiments of FIGS. 2-4, as horizontal diffusion of the first gas sprayed from the central portion of the first plate 220 may be partially suppressed due to the gas distribution member 240, the first gas may be generally uniformly distributed in the first diffusion space 221.

The first gas in the first diffusion space 221 may be uniformly distributed over the first plate 220. Also, the first gas passing through the first plate 220 may thereby be uniformly distributed in the second diffusion space 222.

The second gas is jetted into the second diffusion space 222 through the second gas supply line 236. To substantially uniformly distribute the second gas in the second diffusion space 222, the second diffusion space 222 may have stepped structures. However, particularly when the second gas has a low molecular weight, the second diffusion space may not have stepped structures. For example, when the second gas includes $O_2$ or $N_2O$ having a molecular weight less than that of $Ti(tmhd)_2$ or $Zr(tmhd)_2$, the second gas including $O_2$ or $N_2O$ generally easily diffuses in a small space. Thus, the second gas may readily diffuse regardless of whether the second diffusion space 222 has the stepped structures.

As shown in FIG. 3, the second gas widely diffuses in the second diffusion space 222 and may also be readily mixed with the first gas passing through the first plate 220. Accordingly, the first and the second gases may be uniformly distributed in the second diffusion space 222.

Numbers of the stepped portions provided to the gas distribution member 240 may vary in accordance with the arrangement of arrays of the first outlet holes 229 in the first plate 220. In particular, with reference to the embodiments in FIGS. 3 and 4, the first outlet holes 229 are disposed concentrically with respect to a central axis of the first plate 220. The first gas supply lines 226 are disposed spaced apart from each other radially by an angle of about 90° and do not intersect with the first outlet holes 229.

The gas distribution member 240 may have numbers of the stepped portions substantially identical to those of concentric circles of the first outlet holes 229. Further, the concentric circles may have diameters substantially identical to those of the first, the second, the third and the fourth grooves 211, 212, 213 and 214, respectively.

As described above, the horizontal diffusion of the first gas may be partially suppressed by the gas distribution member 240 so that the first gas drops downwardly from the stepped portions of the gas distribution member 240. To increase an amount of the first gas passing through the first plate 220, the first outlet holes 229 may be disposed at positions on which the first gas drops. In the embodiments of FIGS. 2-4, the gas distribution member 240 has four stepped portions and the first outlet holes 229 are disposed along four corresponding diameter concentric circles on the first plate 220. The first outlet holes 229 may be arranged in accordance with the numbers of the stepped portions and the shape of the gas distribution member 240. However, the arrangement of the first outlet holes 229 may vary in various embodiments of the present invention.

When the inner face of the head cover 210 has a stepped structure, the gas distribution in the first diffusion space 221 may be improved. Generally, a fluid jetted in a fountain shape drops on regions spaced apart from the position of the jet. Thus, an amount of the fluid dropping in regions adjacent to the jet position may be very small. When a gas having a high molecular weight is jetted, the gas distribution is typically poor. However, according to some embodiments of the present invention, the first gas is uniformly distributed in the first diffusion space 221 due to the gas distribution member 240. Therefore, the amounts of the first gas returning to the central portion of the first plate 220 may be sufficient.

A gas distribution member 240 having a dome shape may have comparatively poor performance. When the gas distribution member 240 has a dome shape, the first gas generally diffuses along the inner face of the first diffusion space 221, thereby concentrating the first gas on the edge portion of the first plate 220. As a result, an amount of the first gas sprayed from the edge portion of the first plate 220 may be increased.

For the embodiments of FIGS. 2-4, the showerhead 200 has a first diffusion space 221 having a height that is gradually increased and a width that is gradually decreased moving from the edge portion of the head cover 210 to the central portion of the head cover 210 in a step-wise manner. Therefore, the first gas may rise upwardly and then widely diffuse. The first gas may horizontally diffuse along the inner face of the head cover 210 and then drop downwardly due to the gas distribution member 240. As a result, the first gas may be uniformly distributed over the first plate 220.

Figure 5:
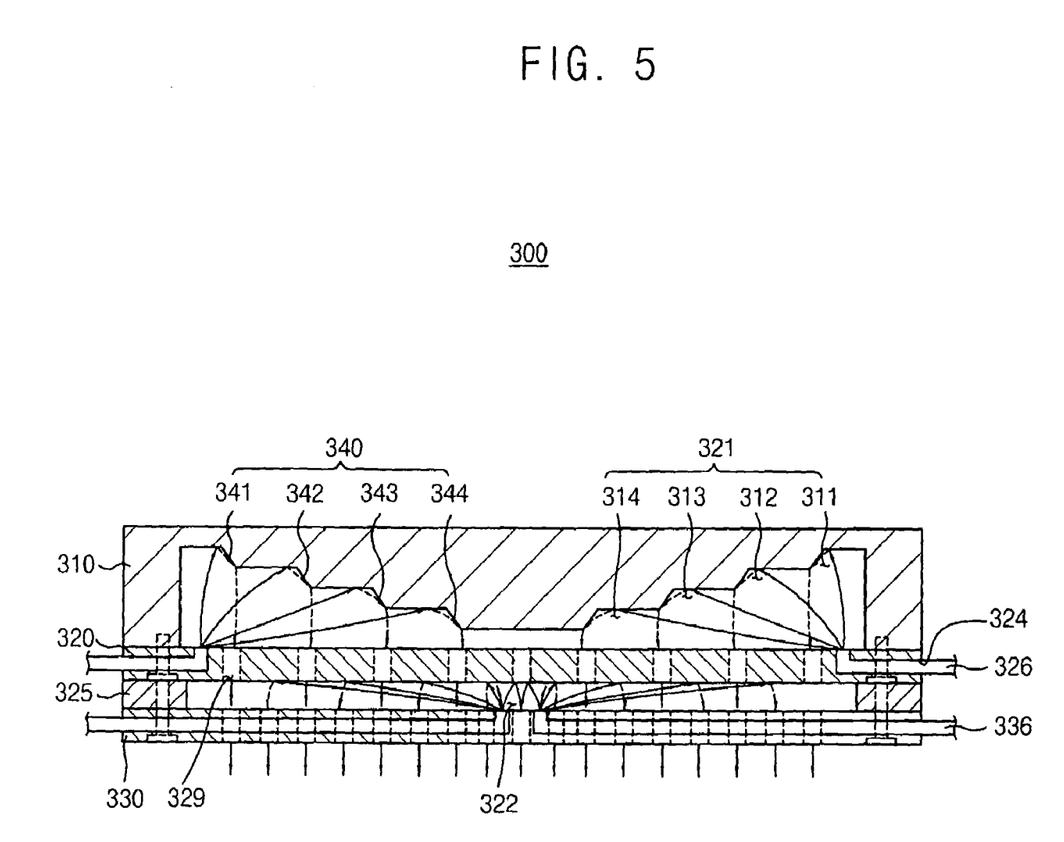
FIG. 5 is a cross sectional view illustrating a showerhead in accordance with other embodiments of the present invention.

Further embodiments of the present invention will now be described with reference to FIG. 5. FIG. 5 is a cross sectional view illustrating a showerhead according to some embodiments of the present invention.

In the embodiments of FIG. 5, a showerhead 300 includes a head cover 310, a first plate 320, a sealing member 325, a second plate 330, a first gas supply line(s) 326, a second gas supply line(s) 336, and a gas distribution member 340.

The showerhead 300 includes various features that are substantially identical to those described with reference to FIGS. 2-4. However, the first gas supply line 326 and the gas distribution member 340 differ in FIG. 5 as will now be further described.

The gas distribution member 340 has a stepped structure provided on a lower face 315 of the head cover 310. The stepped structure of the gas distribution member 340 is a convex structure as contrasted with the concave structure of the gas distribution member 240. In particular, a cylindrical first groove 311 is formed at the lower face 315 of the head cover 310. The first groove 311 has a first outer diameter less than that of the head cover 310, and a first inner diameter. A second groove 312 is formed from an inner end of the first groove 311. The second groove 312 has a second outer diameter substantially identical to the first inner diameter, and a second inner diameter. A third groove 313 is formed from an inner end of the second groove 312. The third groove 313 has a third outer diameter substantially identical to the second inner diameter, and a third inner diameter. A fourth groove 314 is formed from an inner end of the third groove 313. The fourth groove 314 has a fourth outer diameter substantially identical to the third inner diameter, and a fourth inner diameter. Thus, a first stepped portion 341 is formed between the first groove 311 and the lower face 315. A second stepped portion 342 is formed between the first and the second grooves 311 and 312. In addition, a third stepped portion 343 is formed between the second and the third grooves 312 and 313. A fourth stepped portion 344 is formed between the third and the fourth grooves 313 and 314. As a result, a stepped structure is formed on the lower face 315 of the head cover 310 to define the first diffusion space 321 in the head cover 310. As the first outer diameter is shorter than the outer diameter of the head cover 310, the first diffusion space 321 is isolated from the outside by the head cover 310.

Comparing the first diffusion space 321 of FIG. 5 with the first diffusion space 221 of FIG. 3, the first diffusion space 321 has a convex shape, whereas the first diffusion space 221 has the concave shape. Thus, the gas distribution member 340 of FIG. 5 has a configuration that may be described as symmetrical to the gas distribution member 240 of FIG. 3. The numbers of stepped portions included in the gas distribution member 340 may be substantially identical to those of circumferentially distributed sets of the first outlet holes 329 formed extending through the first plate 320.

The first outlet holes 329 illustrated in FIG. 5 are formed through the first plate 320 along four concentric circles of increasing diameters extending out from the central portion thereof. Thus, the illustrated number of concentric circles are substantially identical to those of the stepped portions of the gas distribution members 340. However, the number of the concentric circles may vary in various embodiments of the present invention.

A first horizontal hole (or holes, two visible in the cross-section of FIG. 5) 324 is formed in a horizontal direction extending into the first plate 320. The first horizontal hole 324 is formed extending from a side face of the first plate 320 towards central portion of the first plate 320. The first horizontal hole 324 does not intersect with the first outlet holes 329. An inner end (towards the central portion) of the first horizontal hole 324 is opened upwardly. Thus, the first horizontal hole 324 generally has an L shape. Four first horizontal holes 324 may be disposed at substantially identical radially offset angular locations, for example, about every 90°. In other embodiments, the first horizontal holes 324 may be arranged spaced apart from each other by an angle of more or less than 90°.

A first gas supply line 326 is inserted into the first horizontal hole 324 (or a line into each corresponding hole). A first gas is introduced into the first diffusion space 321 through the first gas supply line 326. As compared with the embodiments of FIG. 3, the first gas is jetted from an opening formed at an edge portion of the first plate 320. The first gas is sprayed from the edge portion of the first plate 320 towards the head cover 310.

The first plate 320 is coupled to the lower face 315 of the head cover 310. The sealing member 325, having a ring shape, is coupled to a lower face of the first plate 320. The second plate 330 is coupled to a lower face of the sealing member 325. The first and second plates 320 and 330 and the sealing member 325 define a second diffusion space 322 into which a second gas is introduced. The sealing member 325 and the second plate 330 may be substantially identical to those of the embodiments of FIGS. 2-4 and, therefore, need not be further described herein.

Operations for uniformly distributing the first and second gases using the showerhead of FIG. 5 according to some embodiments of the present invention will now be described. The first gas passing through the first gas supply line 326 is jetted from the edge portion of the first plate 320 to the edge portion of the head cover 310. The jetted first gas diffuses in a generally spherical shape, and then contacts against the gas distribution member 340. In particular, a portion of the first gas sprayed to the first groove 311 diffuses horizontally and contacts the first stepped portion 341, and then the portion of the first gas sprayed to the first groove 311 drops downwardly. After a portion of the first gas sprayed to the second groove 312 diffuses horizontally and contacts the second stepped portion 342, the portion of the first gas sprayed to the second groove 312 drops downwardly. After a portion of the first gas sprayed to the third groove 313 diffuses horizontally and contacts the third stepped portion 343, the portion of the first gas sprayed to the third groove 313 drops downwardly. A portion of the first gas sprayed to the fourth groove 314 diffuses horizontally and contacts the fourth stepped portion 344, and then the portion of the first gas sprayed to the fourth groove 314 drops downwardly. Therefore, the first gas may be uniformly distributed over the first plate 320.

For the embodiments of FIG. 5, as horizontal diffusion of the first gas sprayed from the edge portion of the first plate 320 is partially suppressed due to the gas distribution member 340, the first gas may be uniformly distributed in the first diffusion space 321. The first gas in the first diffusion space 321 may, therefore, be uniformly distributed over the first plate 320. As such, the first gas passing through the first plate 320 may be uniformly distributed in the second diffusion space 322.

The second gas may widely diffuse in the second diffusion space 322 and may thereby be readily mixed with the first gas passing through the first plate 320. Accordingly, the first and second gases may be uniformly distributed in the second diffusion space 322, thereby improving distributions of the first and second gases in the second diffusion space 322.

The gas distribution member 340 may have stepped portions substantially corresponding to (i.e., radially aligned with) respective ones of the concentric circles of the first outlet holes 329.

For the embodiments of FIG. 5, the horizontal diffusion of the first gas may be partially suppressed by the gas distribution member 340 having the convex structure so that the first gas may be more uniformly distributed in the first diffusion space 321. The first gas in the first diffusion space 321 passes through the first plate 320, and is then distributed in the second diffusion space 322. The first gas is mixed with the second gas in the second diffusion space 322. The mixed gas may be uniformly distributed on a semiconductor substrate through the second plate 330.

Figure 6:
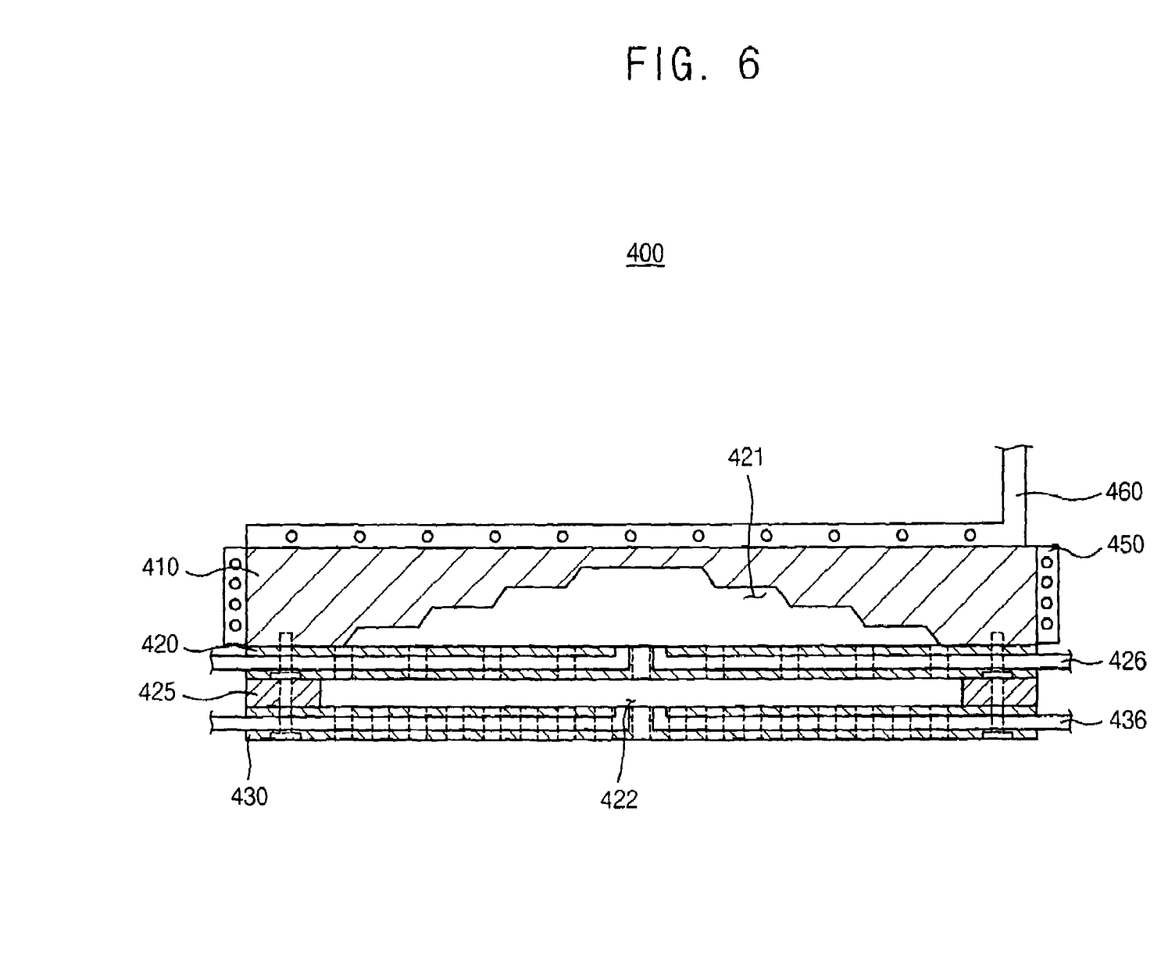
FIG. 6 is a cross sectional view illustrating a showerhead in accordance with further embodiments of the present invention.

Further embodiments of the present invention will now be described with reference to FIG. 6. FIG. 6 is a cross sectional view illustrating a showerhead according to further embodiments of the present invention. As shown in FIG. 6, a showerhead 400 includes a head cover 410, a first plate 420, a sealing member 425, a second plate 430, a first gas supply line 426, a second gas supply line 436, a gas distribution member 440, a heating member 450 and a cooling member 460.

The showerhead 400 of the embodiments of FIG. 6 includes aspects substantially identical to those in the previously described embodiments and also includes the heating member 450 and the cooling member 460. The heating member 450 may surround and enclose the head cover 410. The heating member 450 heats the head cover 410 to control a temperature of a gas in a first diffusion space 421. Examples of the heating member 450 include a heating coil, a heating jacket, a lamp, etc. A heating jacket is shown as the heating member 450 in FIG. 6.

The heating member 450 transmits heat into the head cover 410 to heat the gas in the first diffusion space 421. Additionally, a temperature sensor (not shown) for monitoring and controlling the temperature of the gas may be used. Examples of the temperature sensor include a thermocouple or the like.

To control the temperature in the first diffusion space 421, the cooling member 460 as well as the heating member 450 may be used. The cooling member 460 cools the head cover 410 to control the temperature of the gas in the first diffusion space 421. The cooling member 460 may include a cooling line through which a cooling media, such as water, flows and the like.

As described above, the showerhead 400 of FIG. 6 includes the heating member 450 and the cooling member 460 for controlling the temperature of the gas in the first diffusion space 421. Thus, a gas sensitive to variations of temperatures may be used in the showerhead 400 while controlling the temperature thereof.

Operations for controlling the temperature of the gas in the first diffusion space 421 according to some embodiments of the present invention will now be described. Generally, a deposition process for forming a layer on a semiconductor substrate may be performed at a high temperature of no less than about 600° C. Thus, the showerhead 400 may be exposed to an environment having a high temperature. When a gas sensitive to the variations of temperature is introduced into the first diffusion space 421, cooling the head cover 410 may be used to prevent abnormal changes of the gas. The cooling member 460 absorbs heat in the head cover 410 to cool the gas in the first diffusion space 421. On the contrary, to heat the gas in the first diffusion space 421, the heating member 450 is used. The heating member 450 provides heat to the head cover 410 to heat the gas in the first diffusion space 421.

Figure 7:
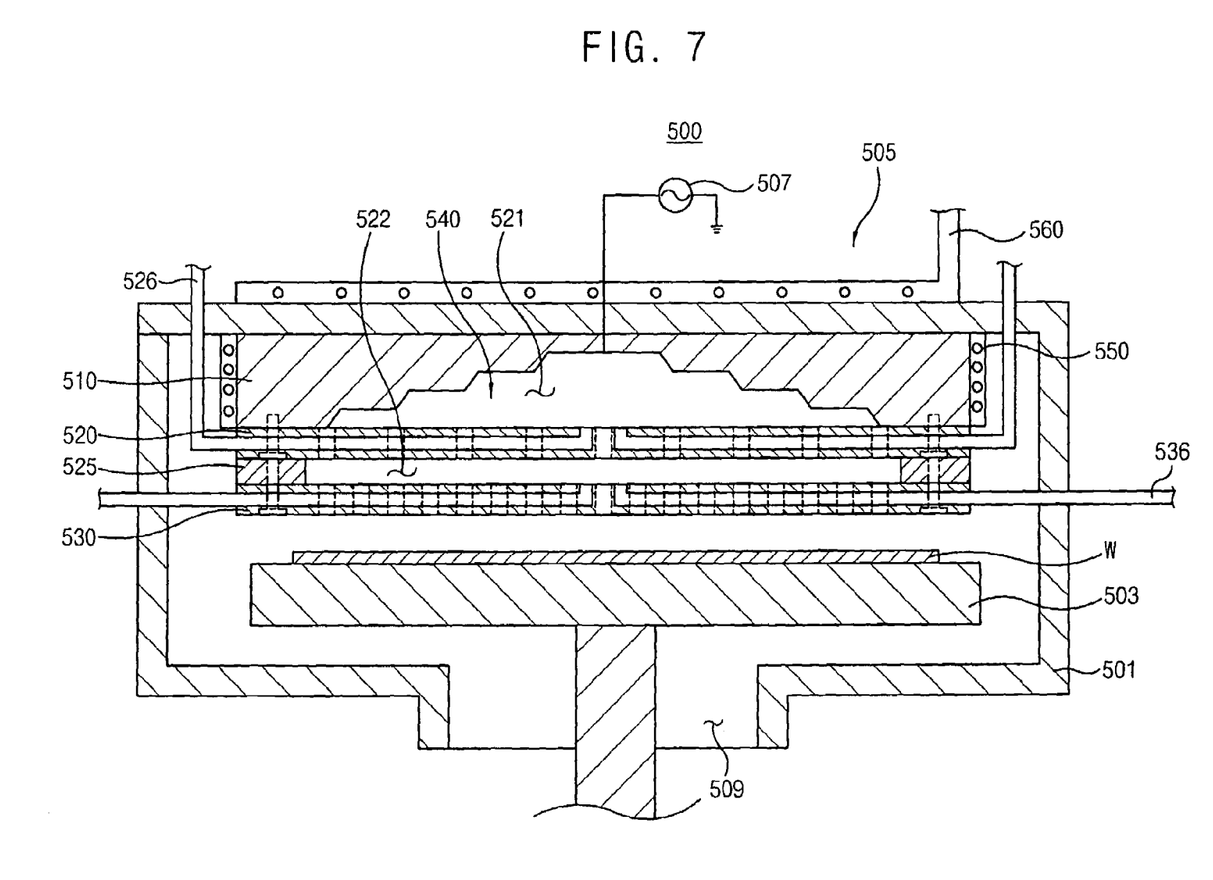
FIG. 7 is a cross sectional view illustrating an apparatus for processing a semiconductor substrate in accordance with some embodiments of the present invention.

Yet further embodiments of the present invention will now be described with reference to FIG. 7. FIG. 7 is a cross sectional view illustrating an apparatus for processing a semiconductor substrate in accordance with some embodiments of the present invention. As shown in the embodiments of FIG. 7, an apparatus 500 for processing a semiconductor includes a process chamber 501, a chuck 503, a showerhead 505 and a high-frequency power source 507. The showerhead 505 includes a head cover 510, a first plate 520, a sealing member 525, a second plate 530, a first gas supply line 526, a second gas supply line 536, a gas distribution member 540, a heating member 550 and a cooling member 560. The illustrated showerhead 505 includes various aspects substantially identical to those in the previously described embodiments, which aspects will not be further described herein.

The process chamber 501 in the illustrated embodiments has a cylindrical shape. The process chamber 501 has an internal space in which processes for processing a semiconductor substrate W, positioned on the chuck 503, are carried out. The showerhead 505 is disposed in the internal space of the process chamber 501. The chuck 503 is disposed under the showerhead 505 in the internal space.

The showerhead 505 provides gases used for processing the substrate W into the process chamber 501. The high-frequency power source 507 is connected to the showerhead 505. The high-frequency power source 507 provides a high-frequency voltage to the showerhead 505 to convert the gases into plasma.

The chuck 503 supports and fixes the substrate W. The chuck 503 fixes the substrate W, for example, using a vacuum or electrostatic power.

A discharge hole 509 is formed through a lower portion of the process chamber 501. The discharge hole 509 is connected to a vacuum pump (not shown) to discharge the gases and byproducts in the process chamber 501. Thus, an inner pressure of the process chamber 501 may be controlled by the discharge operations.

Operations for processing the substrate W in the process chamber 501 according to some embodiments of the present invention will now be described. Operations may include a deposition process, an etching process, etc. The deposition process is performed in the process chamber 501. In particular, the substrate W loaded into the process chamber 501 is disposed on the chuck 503. The process chamber is maintained under vacuum. A first gas is introduced into the first diffusion spacer 521 through the first gas supply line 526. The first gas is jetted from a central portion of the first plate 520.

The jetted first gas collides against the gas distribution member 540 and is substantially uniformly distributed in the first diffusion space 521. The first gas in the first diffusion space 521 flows into the second diffusion space 522 through the first plate 520 as the pressure in the first diffusion space 521 increases. The first gas is distributed in the second diffusion space 522.

The first gas is mixed with the second gas in the second diffusion space 522. The mixed gas is substantially uniformly sprayed on the substrate W on the chuck 503 through the second plate 530.

As the high-frequency power source 507 provides the high-frequency voltage to the process chamber 501, a high electric field may be formed in the process chamber 501. Thus, the mixed gas may be exposed to the high electric field to be converted into a plasma, which forms a layer on the substrate W.

Techniques for generating the high-frequency voltage in the process chamber 501 are well known. Additionally, to increase intensity of the high-frequency voltage in the process chamber 501, a bias power may be connected to the chuck 503.

As described above, a thickness of the layer formed on the substrate W may be significantly influenced by the distribution of the first and second gases over the substrate W. For example, when the first gas has a molecular weight less than that of the second gas, the first gas may concentrate on the central portion of the first plate 520 due to the gas distribution member 540 and the second gas may also concentrate on the central portion of the second plate 530. As a result, the mixed gas may concentrate on the central portion of the substrate W. Thus, in some embodiments of the present invention, to substantially uniformly distribute the first and the second gases over the substrate W, the first gas has molecular weight greater than that of the second gas.

When the gases include a reaction gas and a source gas, the reaction gas generally corresponds to the first gas and the source gas generally corresponds to the second gas. Examples of the reaction gas include $O_2$, $N_2O$, $O_3$, etc. Examples of the source gas include $Pb(tmhd)_2$, $Ti(tmhd)_2$, $Zr(tmhd)_2$, etc. Further, the first gas may have a sensitivity with respect to variations of temperatures higher than that of the second gas.

The heating member 550 and/or the cooling member 560 may be provided (thermally contact) to the head cover 510 to control the temperature of the first gas in the first diffusion space 521. Additionally, the heating member 550 and/or the cooling member 560 may be provided to the sealing member 525 and/or the second plate 530 to control the temperature of the second gas in the second diffusion space 522.

As the reaction gas is typically more sensitive to the variations of the temperatures than the source gas, the reaction gas may be sprayed into the first diffusion space 521 and the source gas may be sprayed into the second diffusion space 522.

The gas may be uniformly distributed on the substrate W using the showerhead 505 so that the substrate W is precisely processed. Therefore, characteristics of the semiconductor device may be improved and errors in subsequent processing operations may be reduced.

Figure 8:
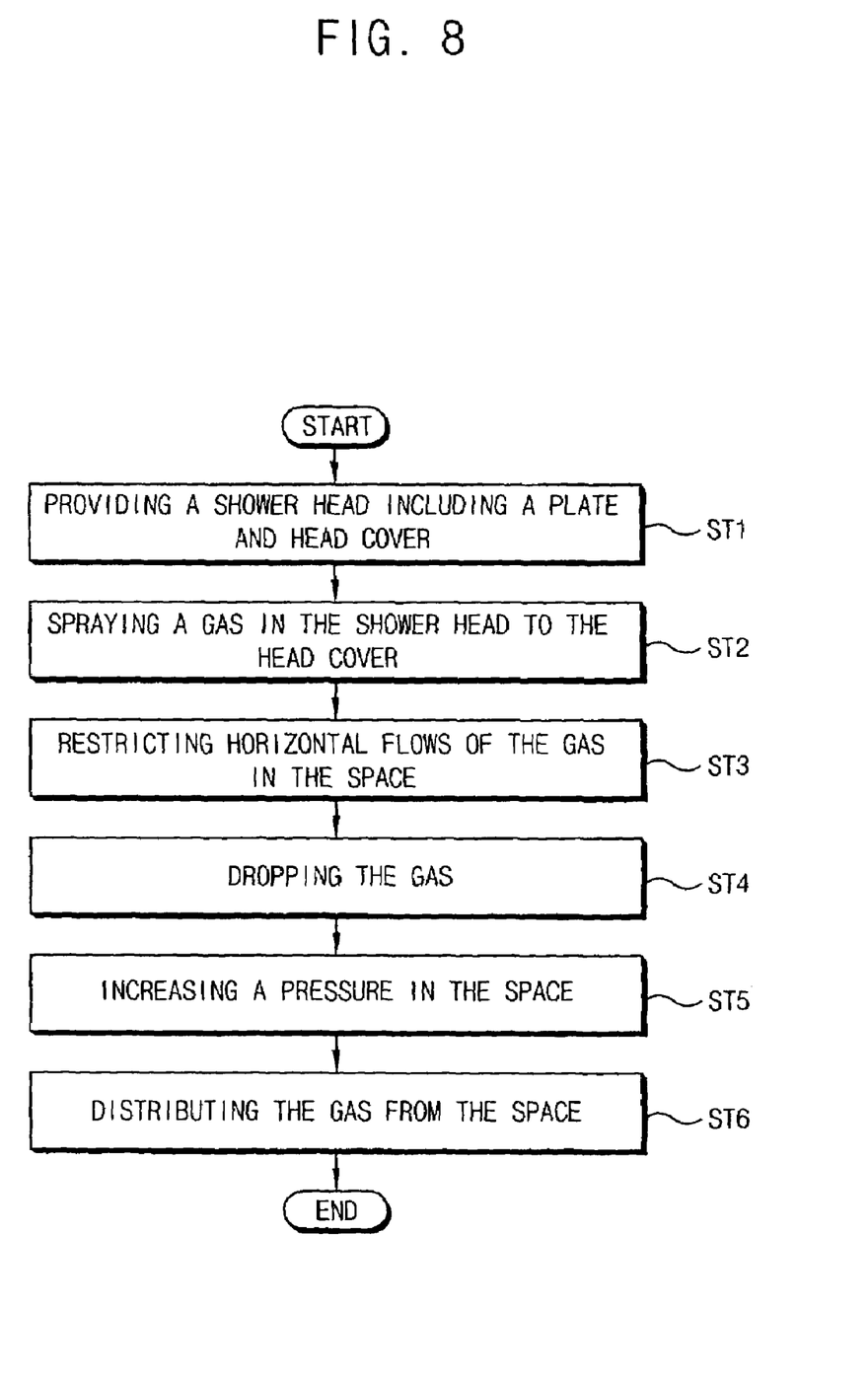
FIG. 8 is a flow chart illustrating methods of distributing a gas in accordance with some embodiments of the present invention.

Further embodiments of the present invention will now be described with reference to FIG. 8. FIG. 8 is a flow chart illustrating a method of distributing a gas in accordance with a fifth embodiment of the present invention. As shown in FIG. 8, at block ST1, a showerhead is prepared. The showerhead includes a plate having a plurality of holes, and a head cover combined with the plate to define a diffusion space between the plate and the head cover.

At block ST2, a gas is spayed into the diffusion space towards the head cover. The gas may, for example, be sprayed from a central portion of the plate to the head cover. In other embodiments, the gas may be sprayed from an edge portion of the plate to the head cover. Further, the gas may be sprayed from the edge portion of the plate along the central portion of plate.

An inner face of the head cover may have a shape that varies in accordance with spraying directions of the gas with respect to the plate. When the gas is sprayed from the central portion of the plate, the inner face of the head cover in some embodiments has a stepped structure that is gradually recessed (i.e, stepwise increase in height) from the edge portion of the head cover to the central portion of the head cover. When the gas is sprayed from the edge portion of the plate, the inner face of the head cover in some embodiments has a stepped structure that is gradually protruded (i.e., stepwise decreased height) from the edge portion of the head cover to the central portion of the head cover. Also, when the gas is sprayed from the edge portion of the plate along central portion of the plate, the inner face of the head cover may have an annular stepped structure.

At block ST3, the gas sprayed to the head cover collides against (contacts) a gas distribution member that partially suppresses horizontal diffusion of the gas. At block ST4, the gas drops downwardly to be substantially uniformly distributed on the plate. At block ST5, an additional gas is continuously introduced into the diffusion space to increase a pressure in the diffusion space. At block ST6, the gas passes through the plate from the diffusion space to be substantially uniformly distributed on an object, for example a semiconductor substrate.

For the embodiments of FIG. 8, the gas passing through the plate from the diffusion space may be uniformly distributed by use of the gas distribution member. Thus, for a process that is greatly influenced by the gas distribution, for example a process for processing a semiconductor substrate, efficiency of the process may be significantly improved and errors in following processes may be considerably reduced according to some embodiments of the present invention.

As described above, in some embodiments of the present invention, the gas is jetted into the diffusion space in the showerhead. The gas collides against the gas distribution member provided in the showerhead to substantially uniformly distribute over the plate. As a result, the gas may be uniformly distributed from the showerhead.

Also, the showerhead may be positioned in the process chamber so that the substrate may be accurately processed using the uniformly distributed gas. Thus, the characteristics of the semiconductor device may be improved and errors in following processes may be significantly reduced.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A showerhead, comprising:
   a plate having a plurality of gas outlet holes extending therethrough;
   a head cover coupled to the plate to form a space between the plate and the head cover;
   a gas supply inlet line disposed in the plate that is configured to provide gas to the space directed toward the head cover; and
   a gas distribution region on an inner face of the head cover facing the space that is configured to partially suppress flow of the gas provided to the space in a direction along the gas distribution region to substantially uniformly distribute the gas in the space,
   wherein the direction along the gas distribution region comprises a horizontal direction and the gas provided to the space is directed in a substantially vertical upward direction and wherein the gas distribution region comprises a stepped structure providing a height of the space that decreases from a position where the gas is provided to the space to a position in the space displaced therefrom.

2. The showerhead of claim 1, wherein the position where the gas is provided is in a central portion of the space and wherein the stepped structure is convex.

3. The showerhead of claim 1, wherein the position where the gas is provided is in an edge portion of the space and wherein the stepped structure is concave.

4. The showerhead of claim 1, wherein the plurality of gas outlet holes are arranged in concentric circles and wherein the stepped structure has a corresponding arrangement of steps aligned with the concentric circles of gas outlet holes.

5. The showerhead of claim 1, wherein the stepped structure comprises a plurality of stepped grooves formed in the inner face of the head cover.

6. The showerhead of claim 1, wherein the gas distribution region is concentrically arranged with respect to a position from which the gas is provided and is configured to partially suppress a horizontal flow of the gas in the space.

7. The showerhead of claim 6, wherein the stepped structure comprises stepped portions.

8. The showerhead of claim 6, wherein the position corresponds to at least one position in a central portion of the space, and wherein the stepped structure includes stepped grooves concentrically positioned on the inner face of the head cover.

9. The showerhead of claim 6, wherein the position corresponds to a plurality of positions that are arranged on a substantially common plane at substantially identical angular intervals around a central axis of the space.

10. The showerhead of claim 6, wherein the position corresponds to a plurality of positions that are arranged at spaced apart locations along an edge portion of the space at substantially identical angular intervals around a central axis of the space, and wherein the stepped structure includes stepped protrusions that are concentrically positioned on the inner face of the head cover.

11. The showerhead of claim 6, wherein the position corresponds to a plurality of positions that are arranged at spaced apart locations from a central portion to an edge portion of the space at substantially identical intervals in the space,
   and wherein the stepped structure includes annular grooves concentrically positioned on the inner face of the head cover.

12. The showerhead of claim 6, wherein the gas supply inlet line is inserted into the plate in a horizontal direction.

13. The shower head of claim 6, further comprising:
   a sealing member enclosing a lower portion of the plate;
   a second plate coupled to the sealing member to form a second space between the sealing member and the second plate; and
   second gas supply inlet line that is configured to provide a second gas to the second space in a direction toward the plate.

14. The showerhead of claim 13, wherein the second gas supply inlet line extends from an edge portion of the second space to a central portion of the second space.

15. The showerhead of claim 13, wherein the second gas supply inlet line is inserted into the second plate in a horizontal direction.

16. The showerhead of claim 1, wherein the showerhead comprises a showerhead for a semiconductor substrate processing apparatus and wherein the first gas comprises a source gas or a reaction gas for forming a film on the semiconductor substrate.

17. A showerhead, comprising:
   a plate having a plurality of gas outlet holes extending therethrough;
   a head cover coupled to the plate to form a space between the plate and the head cover;
   a gas supply inlet line disposed in the plate that is configured to provide gas to the space directed toward the head cover; and
   a gas distribution region on an inner face of the head cover facing the space including a stepped structure providing a height of the space that decreases from a position where the gas is provided to the space to a position in the space displaced therefrom.

18. The showerhead of claim 17, wherein the position where the gas is provided is in a central portion of the space and wherein the stepped structure is convex.

19. The showerhead of claim 17, wherein the position where the gas is provided is in an edge portion of the space and wherein the stepped structure is concave.

20. The showerhead of claim 17, wherein the plurality of gas outlet holes are arranged in concentric circles and wherein the stepped structure has a corresponding arrangement of steps aligned with the concentric circles of gas outlet holes.

21. An apparatus for processing a substrate comprising:
   a process chamber configured to receive a substrate to be processed therein;
   a chuck in the process chamber that supports the substrate; and
   a showerhead positioned to provide a gas to the process chamber, the showerhead including a plate having a plurality of gas outlet holes extending therethrough, a head cover coupled to the plate to form a space between the plate and the head cover, a gas supply inlet line disposed in the plate that is configured to provide gas to the space directed toward the head cover and a gas distribution region on an inner face of the head cover facing the space that is configured to partially suppress flow of the gas provided to the space in a direction along the gas distribution region to substantially uniformly distribute the gas in the space,
   wherein the direction along the gas distribution region comprises a horizontal direction and the gas provided to the space is directed in a substantially vertical upward direction and wherein the gas distribution region comprises a stepped structure providing a height of the space that decreases from a position where the gas is provided to the space to a position in the space displaced therefrom.

22. The apparatus of claim 21 wherein the gas distribution region is concentrically arranged with respect to a position from which the gas is supplied, the gas distribution region partially suppressing a horizontal flow of the gas and wherein the apparatus further comprises:

a discharging member configured to discharge remaining gas and byproducts generated in a process for processing the substrate to control a pressure in the process chamber.

23. The apparatus of claim 22, further comprising a high-frequency power source that provides a high-frequency power to the showerhead to convert the gas in the process chamber into a plasma.

24. The apparatus of claim 23, wherein the heating member encloses the showerhead, and the cooling member is arranged on the showerhead.

25. The apparatus of claim 22, further comprising a heating member and a cooling member that control a temperature of the gas.

* * * * *

UNITED STATES PATENT AND TRADEMARK OFFICE
CERTIFICATE OF CORRECTION

PATENT NO.        : 7,361,228 B2
APPLICATION NO. : 11/060525
DATED              : April 22, 2008
INVENTOR(S)      : Choi et al.

It is certified that error appears in the above-identified patent and that said Letters Patent is hereby corrected as shown below:

Column 18, Claim 13, Line 6:   Please correct "second gas"
                                                To read -- a second gas --

Signed and Sealed this

Eighth Day of July, 2008

JON W. DUDAS
*Director of the United States Patent and Trademark Office*